United States Patent
You

(10) Patent No.: US 10,890,635 B2
(45) Date of Patent: Jan. 12, 2021

(54) STAND ASSEMBLY FOR RF COIL, RF COIL ASSEMBLY AND MAGNETIC RESONANCE IMAGING SYSTEM

(71) Applicant: Siemens Healthcare GmbH, Erlangen (DE)

(72) Inventor: Jun You, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 45 days.

(21) Appl. No.: 16/135,196

(22) Filed: Sep. 19, 2018

(65) Prior Publication Data

US 2019/0086489 A1 Mar. 21, 2019

(30) Foreign Application Priority Data

Sep. 19, 2017 (CN) .......................... 2017 1 0847167

(51) Int. Cl.
*G01R 33/34* (2006.01)
*G01R 33/36* (2006.01)

(52) U.S. Cl.
CPC . *G01R 33/34084* (2013.01); *G01R 33/34007* (2013.01); *G01R 33/3678* (2013.01)

(58) Field of Classification Search
CPC ........ G01R 33/34084; G01R 33/34007; G01R 33/3678
See application file for complete search history.

(56) References Cited

U.S. PATENT DOCUMENTS 5,066,915 A * 11/1991 Omori .................. A61B 5/0555
324/318
2004/0030241 A1 * 2/2004 Green .................. A61B 5/0555
600/422
2007/0035301 A1 2/2007 Nakabayashi et al.
2007/0108980 A1 * 5/2007 Adriany ........... G01R 33/34084
324/318
2014/0145722 A1 * 5/2014 Suzuki ............... G01R 33/3628
324/322

FOREIGN PATENT DOCUMENTS

| CN | 200998253 Y | 1/2008 |
| CN | 201004083 Y | 1/2008 |
| CN | 106814336 A | 6/2017 |
| JP | 2007068984 A | 3/2007 |
| WO | 2012143825 A1 | 10/2012 |

OTHER PUBLICATIONS

Chinese Action dated Jul. 2, 2020, Application No. 2017 108 47167.5, and Google English language translation attached.

* cited by examiner

*Primary Examiner* — Akm Zakaria
(74) *Attorney, Agent, or Firm* — Schiff Hardin LLP

(57) ABSTRACT

A stand assembly for an RF coil has a base, a slide carriage and a connection assembly. The slide carriage is slidably disposed on the base. The connection assembly comprises a first connecting member and a second connecting member. A first slide groove is formed in the first connecting member. The second connecting member comprises a first slider, the first slider being slidable along the first slide groove in a sliding direction and fixable at a preset position. One of the first connecting member and the second connecting member is in fixed connection with the slide carriage, and the other is in fixed connection with the RF coil. The stand is capable of being used universally for multiple types of RF coils.

9 Claims, 6 Drawing Sheets

STAND ASSEMBLY FOR RF COIL, RF COIL ASSEMBLY AND MAGNETIC RESONANCE IMAGING SYSTEM

BACKGROUND OF THE INVENTION

Field of the Invention

The present invention relates to the field of magnetic resonance imaging (MRI), in particular to a stand assembly for an RF coil. The present invention also relates to an RF assembly comprising the stand assembly, and an MRI system.

Description of the Prior Art

In an MRI system, an RF coil is generally mounted slidably on a stand. At the present time, an RF coil in common use must be used together with a dedicated stand; when the RF coil is changed, the stand must also be changed.

SUMMARY OF THE INVENTION

An object of the present invention is to provide a stand assembly for an RF coil, which is capable of being used universally for multiple types of RF coils, is convenient to use and capable of saving costs.

Another object of the present invention is to provide an RF coil assembly, wherein a stand assembly is capable of being used universally for multiple types of RF coil, is convenient to use and capable of saving costs.

Another object of the present invention is to provide an MRI system, wherein a stand assembly for an RF coil is capable of being used universally for multiple types of RF coil, is convenient to use and capable of saving costs.

The present invention provides a stand assembly for an RF coil, having a base, a slide carriage and a connection assembly. The slide carriage is disposed on the base so as to be slidable in a first direction. The connection assembly has a first connecting member and a second connecting member. A first slide groove is formed in the first connecting member. The second connecting member has a first slider that is slidable along the first slide groove in a sliding direction, and is fixable at a preset position. One of the first connecting member and the second connecting member is adapted to be or designed to be in fixed connection with the slide carriage, and the other is in fixed connection with the RF coil.

In the stand assembly according to the invention, the slide carriage is slidably disposed on the base, the connection assembly includes the first connecting member and the second connecting member, which can be taken apart conveniently and quickly, and the first connecting member and second connecting member are disposed on the slide carriage and the RF coil respectively, such that the stand assembly is capable of being used universally for multiple types of RF coil, is convenient to use, and capable of saving costs.

In another embodiment of the stand assembly, two ends of the first slide groove in the sliding direction are open, and a top face is provided with a slit in the sliding direction, with a first depression being formed in a bottom face, opposite to the top face, in the first slide groove. The first slider is matched in shape to the first slide groove and has a sliding part capable of fitting the slit. The first slider can enter the first slide groove through an opening at one end of the first slide groove, and slide into the first slide groove along the slit using the sliding part. A first spring pin is disposed at the first slider. When the first slider slides in the first slide groove, the first spring pin presses against the bottom face of the first slide groove, and when the first slider slides to the preset position, the first spring pin extends into the first depression and fixes a relative position of the first slider in the first slide groove.

In another embodiment of the stand assembly, one end of the first slide groove in the sliding direction is open and another end is closed, and a top face is provided with a slit in the sliding direction. The first slider is matched in shape to the first slide groove and has a sliding part capable of fitting the slit. The first slider can enter the first slide groove through an opening at one end of the first slide groove, slide into the first slide groove along the slit using the sliding part, and slide into abutment with the closed other end of the first slide groove.

In another embodiment of the stand assembly, a cavity is formed in the base, and two second slide grooves are formed in sidewalls of the cavity. Openings of the second slide grooves are opposite one another and extend in the first direction; the slide carriage is disposed in the cavity. The slide carriage includes two second sliders, the second sliders being disposed in the second slide grooves in one-to-one correspondence and being slidable in the second slide grooves. The above structure can reduce the space occupied by the stand assembly, making the stand assembly more convenient to use.

In another embodiment of the stand assembly, multiple second depressions are formed on an inner surface of the cavity, the second depressions being arranged in the first direction. The slide carriage further has a second spring pin. When the slide carriage slides in the cavity, the second spring pin presses against an inner surface of the cavity and can slide into the second depressions so as to fix a relative position of the slide carriage in the cavity, making the stand assembly more convenient to use.

In another embodiment of the stand assembly, the slide carriage further has a sliding platform, a rotation shaft, a mounting platform and a gear. The second sliders are disposed on the sliding platform; the rotation shaft is disposed on the sliding platform so as to be rotatable in an axial direction of the rotation shaft. The mounting platform is in fixed connection with the rotation shaft and rotatable with the rotation shaft, one of the first connecting member and the second connecting member being in fixed connection with the mounting platform, and the other being in fixed connection with the RF coil. The gear is fixed to one end of the rotation shaft and coaxial with the rotation shaft. The base further has a threaded rod and a rotary knob. An axial direction of the threaded rod is perpendicular to the rotation shaft and the threaded rod is rotatable in the axial direction thereof, the threaded rod meshing with the gear, and rotation of the threaded rod being capable of driving rotation of the gear in the axial direction thereof; the rotary knob is fixed to one end of the threaded rod. The mating between the threaded rod and the gear can adjust the angle of the RF coil and lock the position thereof, making the stand assembly more convenient to use.

In another schematic embodiment of the stand assembly, the slide carriage further comprises a sliding platform, a mounting platform and a rack. The second sliders are disposed on the sliding platform. The mounting platform is disposed on the sliding platform so as to be slidable in a second direction; one of the first connecting member and the second connecting member is in fixed connection with the mounting platform, and the other is in fixed connection with the RF coil; a direction of extension of the rack is parallel to the second direction, and the rack is fixed to the mounting platform. The base further has a threaded rod and a rotary knob. An axial direction of the threaded rod is parallel to the direction of extension of the rack and the threaded rod is rotatable in the axial direction thereof, the threaded rod meshing with the rack, and rotation of the threaded rod being capable of driving movement of the rack in the direction of extension thereof. The rotary knob is disposed at one end of the threaded rod, and can drive rotation of the threaded rod in the axial direction thereof. The mating between the threaded rod and the rack can adjust the displacement of the RF coil in the second direction and lock the position thereof, making the stand assembly more convenient to use.

The present invention also provides an RF coil assembly, having an RF coil and a stand assembly as described above. One of the first connecting member and the second connecting member is in fixed connection with the slide carriage, and the other is in fixed connection with the RF coil.

In an embodiment of the RF coil assembly, the RF coil is one of a knee joint RF coil, shoulder joint RF coil, wrist joint RF coil or head RF coil.

The present invention also provides an MRI system, which includes the RF coil assembly described above. Such an MRI system has an MR scanner in which the RF coil assembly is situated.

DESCRIPTION OF THE PREFERRED EMBODIMENTS

For understanding the technical features, objectives and effects of the invention, particular embodiments of the present invention are explained with reference to the accompanying drawings, in which identical labels indicate structurally identical components or components with similar structures but identical functions.

No drawing or embodiment described herein should be interpreted as a more preferred or more advantageous technical solution.

Figure 1:
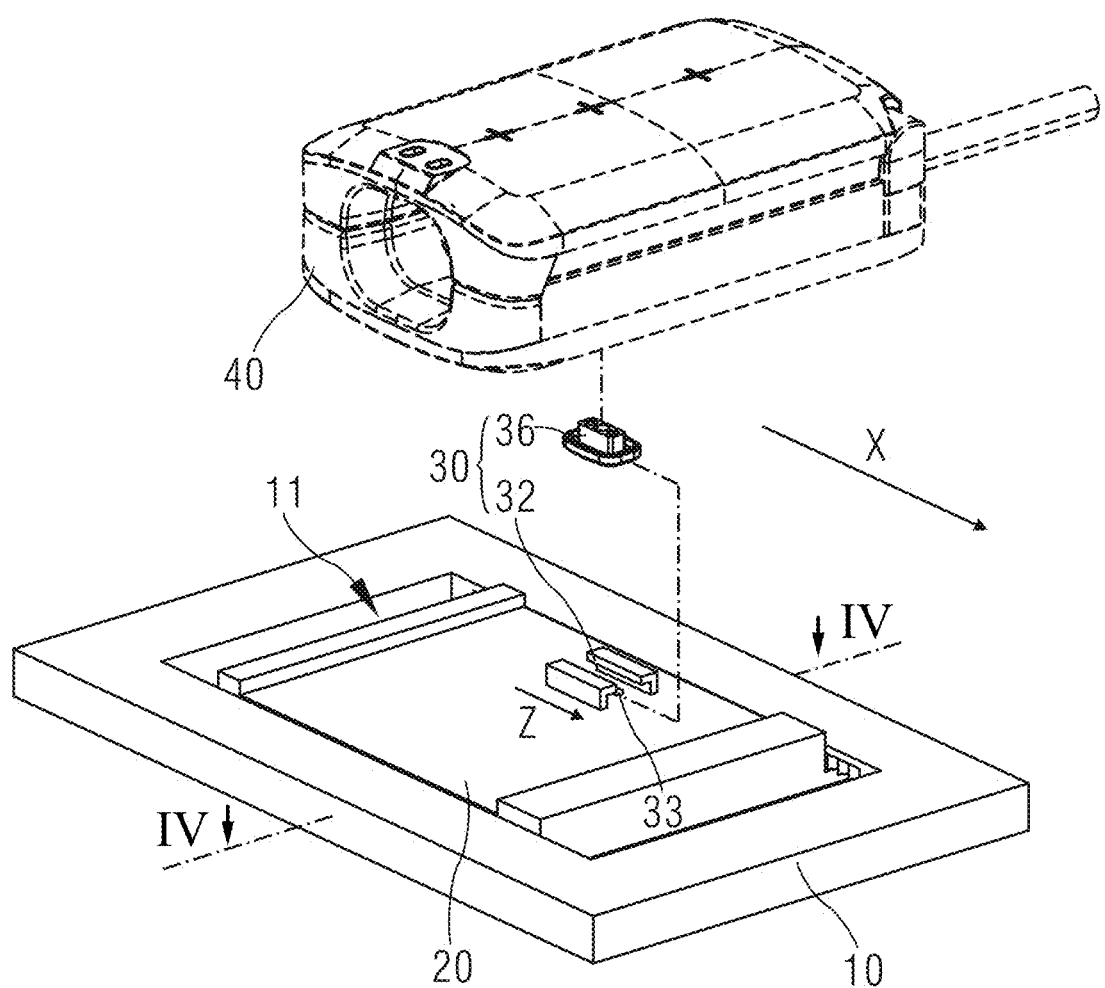
FIG. 1 is an exploded view illustrating an embodiment of a stand assembly for an RF coil according to the invention.
Figure 2:
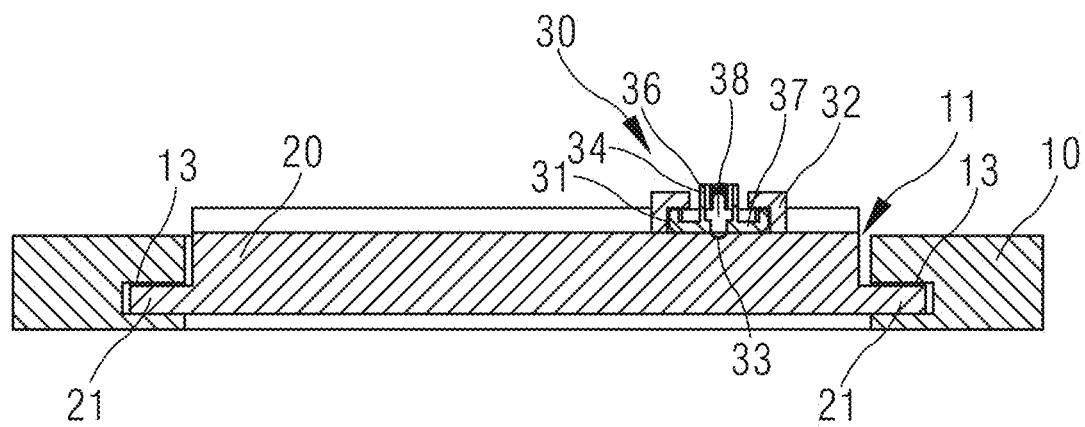
FIG. 2 is a sectional view of the stand assembly in FIG. 1.
Figure 3:
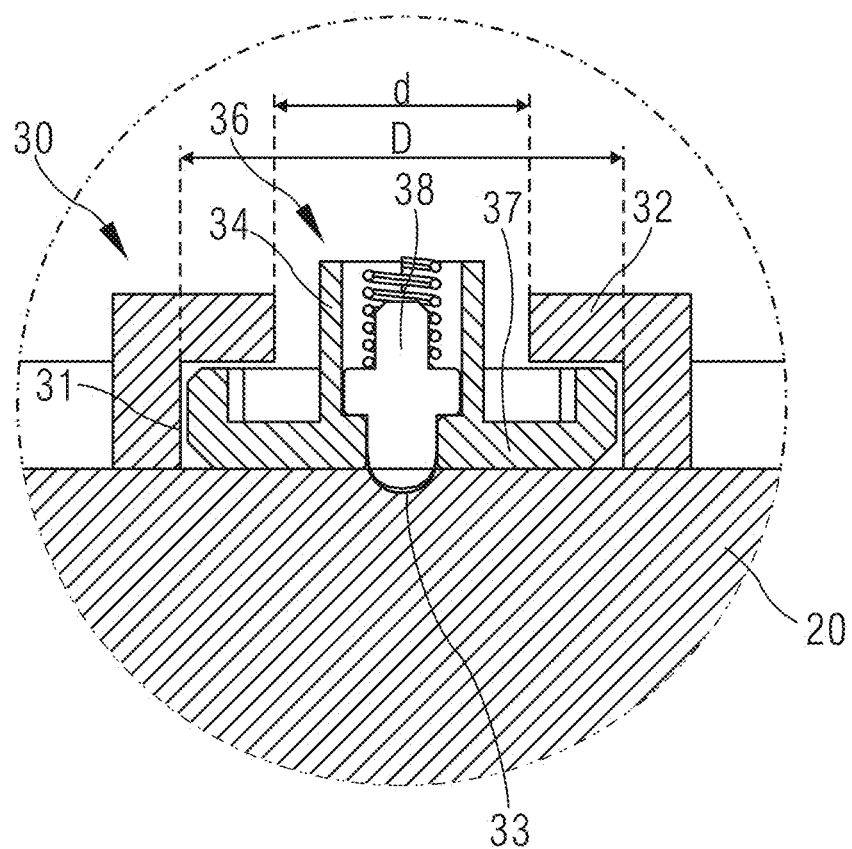
FIG. 3 is partial enlarged diagram of the stand assembly in FIG. 2.

FIG. 1 is an exploded view illustrating an embodiment of a stand assembly for an RF coil; FIG. 2 is a sectional view through the stand assembly in FIG. 1. Referring to FIGS. 1 and 2, the stand assembly has a base 10, a slide carriage 20 and a connection assembly 30. The slide carriage 20 is disposed on the base 10 so as to be slidable in a first direction X; the slide carriage 20 and the base 10 may be connected to each other by a sliding connection assembly such as a guide rail, but could of course also be connected to each other by means of a slide groove and a slider as shown in FIG. 2. FIG. 3 is a partially enlarged view illustrating the stand assembly in FIG. 2. Referring to FIG. 3, the connection assembly 30 has a first connecting member 32 and a second connecting member 36. A first slide groove 31 is formed in the first connecting member 32, with a width D of the first slide groove 31 at a side remote from an opening thereof being greater than a width d at a side close to the opening thereof. The first slide groove may be a T-shaped groove as shown in FIGS. 2 and 3, but a design of another shape, such as a trapezoidal groove or a dovetail groove, could of course also be used according to actual circumstances. The second connecting member 36 has a first slider 37; the first slider can slide along the first slide groove 31 in a sliding direction Z and can be fixed at a preset position. One of the first connecting member 32 and the second connecting member 36 is in fixed connection with the slide carriage 20, the other is in fixed connection with an RF coil 40.

In an embodiment, two ends of the first slide groove 31 in the sliding direction Z are open, and a top face is provided with a slit in the sliding direction Z, with a first depression 33 being formed in a bottom face, opposite to the top face, in the first slide groove 31. The second connecting member 36 includes the first slider 37 and a first spring pin 38. The first slider 37 is matched in shape to the first slide groove 31 and has a sliding part 34 capable of fitting the slit; the sliding part 34 may be a connecting shaft 34 as shown in the figure. The first slider 37 can enter the first slide groove 31 along an opening at one end of the first slide groove 31, and slide into the first slide groove 31 along the slit using the connecting shaft 34. The first spring pin 38 is disposed on the first slider 37. When the first slider 37 slides in the first slide groove 31, the first spring pin 38 presses against an inner surface of the first slide groove 31, and when the first slider 37 slides to a preset position, the first spring pin 38 extends into the first depression 33. An inner wall of the first depression 33 can obstruct the movement of the first spring pin 38 in the first direction X so as to fix a relative position of the first slider 37 in the first slide groove 31. Of course, the first connecting member 32 and the second connecting member 36 are not restricted to the above structure, which could be replaced with another structure in other schematic embodiments.

In the stand assembly provided in the present invention, the slide carriage 20 is slidably disposed on the base 10, the connection assembly 30 includes the first connecting member 32 and the second connecting member 36, the first connecting member 32 and the second connecting member 36 are disposed on the slide carriage 20 and the RF coil 40 respectively, the second connecting member 36 can slide in along one end of the first slide groove 31 by the first slider 37 so as to connect to the first connecting member 32, and when the first slider 37 slides to a preset position, fixing is achieved by means of the first spring pin 38 extending into the first depression 33. When disassembly is carried out, it is only necessary to apply a sufficient force to make the first spring pin 38 slide out of the first depression 33, and the first connecting member 32 and the second connecting member 36 can then be separated by sliding. The structure described above facilitates the installation of the RF coil 40 on the slide carriage 20 and removal of the RF coil from the slide carriage, such that the stand assembly can be used universally for multiple types of RF coil, is convenient to use and can save costs.

In another embodiment, one end of the first slide groove 31 in the sliding direction Z is open and another end is closed, and a top face of the first slide groove 31 is provided with a slit in the sliding direction Z. The first slider 37 is matched in shape to the first slide groove 31 and has a sliding part 34 capable of fitting the slit. The first slider 37 can enter the first slide groove 31 through an opening at one end of the first slide groove 31, slide into the first slide groove 31 along the slit using the sliding part 34, and slide into abutment with the closed other end of the first slide groove 31.

In the embodiment of FIG. 2, a cavity 11 is formed in the base 10, and two second slide grooves 13 are formed in sidewalls of the cavity 11; openings of the second slide grooves 13 are opposite one another and extend in the first direction X. The slide carriage 20 is disposed in the cavity 11. The slide carriage 20 comprises two second sliders 21, with the second sliders 21 being disposed in the second slide grooves 13 in one-to-one correspondence and being slidable in the second slide grooves 13. By having the slide carriage 20 disposed in the cavity 11, the space occupied by the stand assembly can be reduced, making the stand assembly convenient to use.

Figure 4:
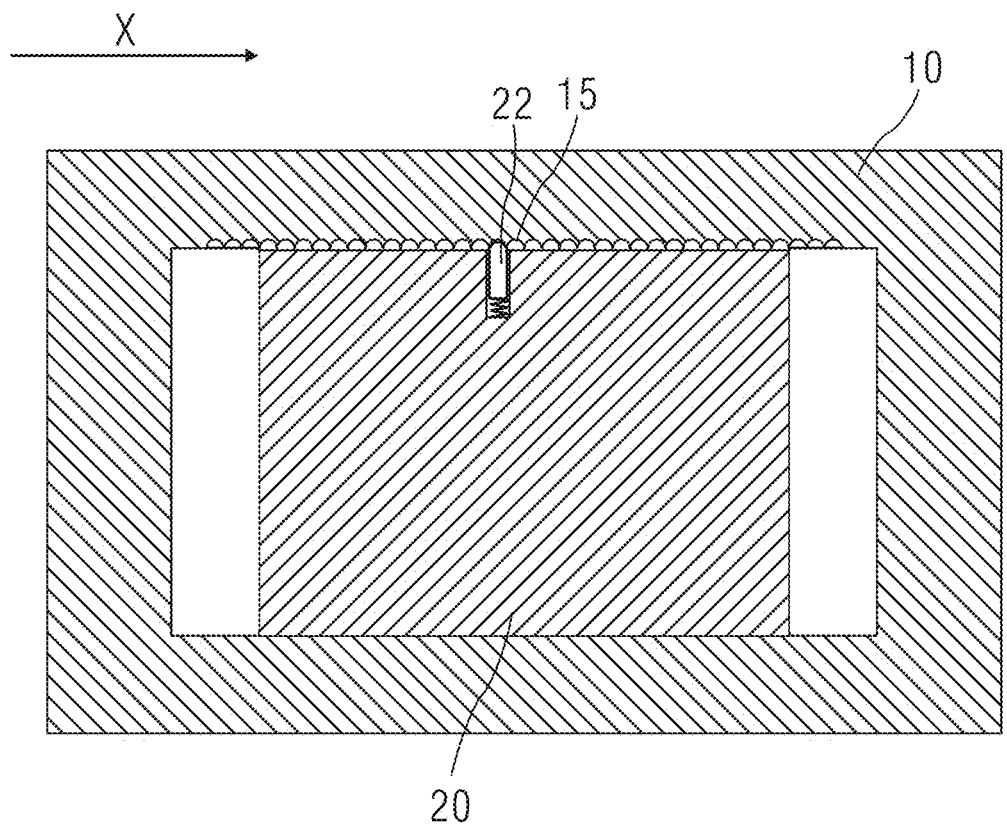
FIG. 4 is a sectional view through IV-IV in FIG. 1.

FIG. 4 is a sectional view illustrating the IV-IV position in FIG. 1. Referring to FIG. 4, in a schematic embodiment, multiple second depressions 15 are formed on an inner surface of the cavity 11. The second depressions 15 are arranged in the first direction X, and the quantity and separation of the second depressions 15 can be designed according to actual circumstances. The slide carriage 20 further has a second spring pin 22; when the slide carriage 20 slides in the cavity 11, the second spring pin 22 presses against an inner surface of the cavity 11 and can slide into the second depressions 15 so as to fix a relative position of the slide carriage 20 in the cavity 11. Once the RF coil 40 has been fixed to the stand assembly by means of the connection assembly 30, the RF coil 40 can slide with the slide carriage 20 and be adjusted to a suitable position of use, and the second depressions 15 and the second spring pin 22 can fix the slide carriage when the RF coil 40 reaches the suitable position of use, making the stand assembly convenient to use.

Figure 5:
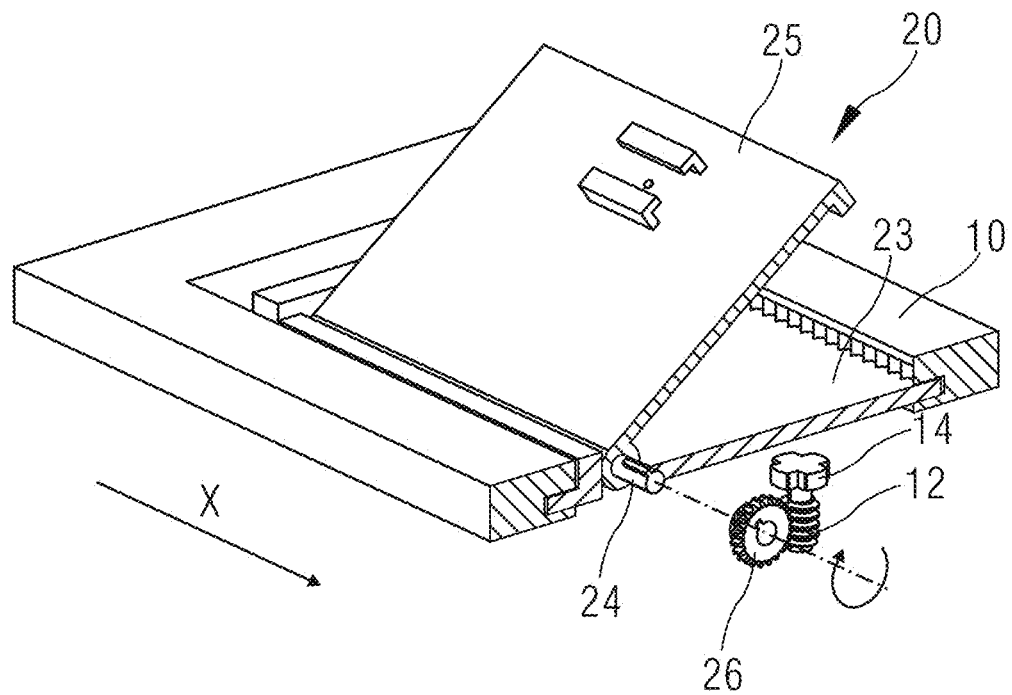
FIG. 5 is a sectional view of another embodiment of the stand assembly for an RF coil according to the invention.

FIG. 5 is a sectional view illustrating another schematic embodiment of a stand assembly for an RF coil; referring to FIG. 5, in the schematic embodiment, the slide carriage 20 further comprises a sliding platform 23, a rotation shaft 24, a mounting platform 25 and a gear 26. The second sliders 21 are disposed on the sliding platform 23. The rotation shaft 24 is disposed on the sliding platform 23 so as to be rotatable in the axial direction thereof. In an embodiment, the axial direction of the rotation shaft 24 is parallel to the first direction X, but is not restricted to this, and may be set according to actual circumstances in other schematic embodiments. The mounting platform 25 is in fixed connection with the rotation shaft 24 and can rotate with the rotation shaft 24. One of the first connecting member 32 and the second connecting member 36 is in fixed connection with the mounting platform 25, and the other is in fixed connection with the RF coil 40. The gear 26 is fixed to one end of the rotation shaft 24 and is coaxial with the rotation shaft 24. The base 10 further has a threaded rod 12 and a rotary knob 14. The axial direction of the threaded rod 12 is perpendicular to the rotation shaft 24 and the threaded rod can rotate in the axial direction thereof; the threaded rod 12 is meshed with the gear 26, and rotation of the threaded rod 12 can drive rotation of the gear 26 in the axial direction thereof, whereas rotation of the gear 26 cannot drive rotation of the threaded rod 12 in the axial direction thereof. The rotary knob 14 is fixed to one end of the threaded rod 12, making it easy to operate the threaded rod 12. The structure described above enables the RF coil 40 mounted on the mounting platform 25 to rotate around the axial direction of the rotation shaft 24, such that the RF coil 40 can be tilted on the stand assembly; at the same time, the mating between the threaded rod 12 and the gear 26 can adjust the angle of the RF coil 40 and lock the position thereof, making the stand assembly more convenient to use.

Figure 6:
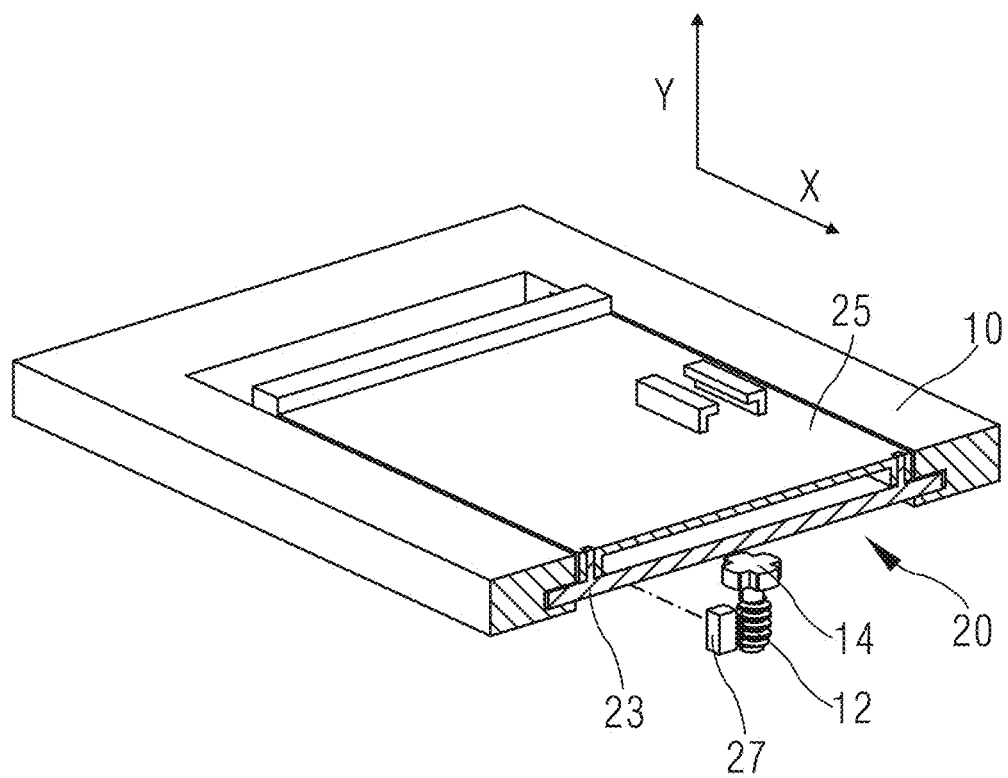
FIG. 6 is a sectional view of another embodiment of a stand assembly for an RF coil according to the invention.

FIG. 6 is a sectional view illustrating another embodiment of a stand assembly for an RF coil. Referring to FIG. 6, in this embodiment, the slide carriage 20 further has a sliding platform 23, a mounting platform 25 and a rack 27. The second sliders 21 are disposed on the sliding platform 23. The mounting platform 25 is disposed on the sliding platform 23 so as to be slidable in a second direction Y; the second direction Y is not limited to the direction shown in FIG. 6, and may be set as a direction perpendicular to a horizontal surface, etc., according to actual circumstances. One of the first connecting member 32 and the second connecting member 36 is in fixed connection with the mounting platform 25, and the other is in fixed connection with the RF coil 40. A direction of extent of the rack 27 is parallel to the second direction Y, and the rack is fixed to the mounting platform 25. The base 10 further has a threaded rod 12 and a rotary knob 14. The axial direction of the threaded rod 12 is parallel to the direction of extension of the rack 27 and the threaded rod can rotate in the axial direction thereof. The threaded rod 12 meshes with the rack 27, and rotation of the threaded rod 12 can drive movement of the rack 27 in the direction of extension thereof, whereas rack 27 cannot drive rotation of the threaded rod 12 in the axial direction thereof. The rotary knob 14 is disposed at one end of the threaded rod 12, making it easy to operate the threaded rod 12. The rotary knob 14 can drive rotation of the threaded rod 12 in the axial direction thereof. The structure described above enables the RF coil 40 mounted on the mounting platform 25 to move in a second direction Y, such that the position of the RF coil 40 can be adjusted in a direction other than the first direction X; at the same time, the mating between the threaded rod 12 and the rack 27 can adjust the displacement of the RF coil 40 in the second direction Y and lock the position thereof, making the stand assembly more convenient to use.

The present invention also provides an RF coil assembly; referring to FIG. 1, the RF coil assembly having an RF coil 40 and a stand assembly as described above. The first connecting member 32 is in fixed connection with the slide carriage 20, and the second connecting member 36 is in fixed connection with the RF coil 40; of course, there is no restriction to this, and in other schematic embodiments, the first connecting member 32 could be in fixed connection with the RF coil 40, and the second connecting member 36 could be in fixed connection with the slide carriage 20. The RF coil 40 is one of a knee joint RF coil, shoulder joint RF coil, wrist joint RF coil or head RF coil, but of course is not limited to this; RF coils of other types could also be chosen according to actual circumstances.

The present invention also provides an MRI system, having the RF coil assembly described above.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A stand assembly for a radio-frequency (RF) coil, comprising:
   a base having a cavity formed therein;
   a slide carriage disposed on the base and in the cavity so as to be slidable in a first direction; and
   a connection assembly including a first connecting member having a first slide groove, and a second connecting member having a first slider, the first slider being slidable along the first slide groove in a sliding direction and fixable at a preset position, and one of the first connecting member and the second connecting member being in fixed connection with the slide carriage, and the other being adapted to be in fixed connection with the RF coil, wherein:

the cavity includes two second slide grooves formed in sidewalls of the cavity, with openings of the second slide grooves being opposite one another and extending in the first direction; and the slide carriage includes two second sliders, the second sliders being disposed in the second slide grooves in one-to-one correspondence and being slidable in the second slide grooves.

2. The stand assembly as claimed in claim 1, wherein:

two ends of the first slide groove in the sliding direction are open, and a top face is provided with a slit in the sliding direction, with a first depression being formed in a bottom face, opposite to the top face, in the first slide groove;

the first slider is matched in shape to the first slide groove and has a sliding part that fits the slit;

the first slider entering the first slide groove through an opening at one end of the first slide groove, and sliding into the first slide groove along the slit using the sliding part;

a first spring pin is disposed at the first slider; and when the first slider slides in the first slide groove, the first spring pin presses against the bottom face of the first slide groove, and when the first slider slides to the preset position, the first spring pin extends into the first depression and fixes a relative position of the first slider in the first slide groove.

3. The stand assembly as claimed in claim 1, wherein:

one end of the first slide groove in the sliding direction is open and another end is closed, and a top face is provided with a slit in the sliding direction;

the first slider is matched in shape to the first slide groove and has a sliding part that fits the slit;

the first slider enters the first slide groove through an opening at one end of the first slide groove and slides into the first slide groove along the slit using the sliding part, and slides into abutment with the closed other end of the first slide groove.

4. The stand assembly as claimed in claim 1, comprising:

multiple second depressions formed on an inner surface of the cavity, the second depressions being arranged in the first direction; and wherein the slide carriage further comprises a second spring pin; when the slide carriage slides in the cavity, the second spring pin presses against an inner surface of the cavity and can slide into the second depressions so as to fix a relative position of the slide carriage in the cavity.

5. The stand assembly as claimed in claim 1, wherein the slide carriage further comprises:

a sliding platform, with the second sliders being disposed on the sliding platform;

a rotation shaft, disposed on the sliding platform so as to be rotatable in an axial direction of the rotation shaft;

a mounting platform in fixed connection with the rotation shaft and rotatable with the rotation shaft, with one of the first connecting member and the second connecting member being in fixed connection with the mounting platform, and the other adapted to be fixed connection with the RF coil; and a gear fixed to one end of the rotation shaft and coaxial with the rotation shaft;

wherein the base further comprises:

a threaded rod having an axial direction perpendicular to the rotation shaft, and the threaded rod being rotatable in the axial direction thereof, the threaded rod meshing with the gear, and rotation of the threaded rod driving rotation of the gear in the axial direction thereof; and a rotary knob fixed to one end of the threaded rod.

6. The stand assembly as claimed in claim 1, wherein the slide carriage further comprises:

a sliding platform, with the second sliders being disposed on the sliding platform;

a mounting platform, disposed on the sliding platform so as to be slidable in a second direction, one of the first connecting member and the second connecting member being in fixed connection with the mounting platform, and the other adapted to be fixed connection with the RF coil; and a rack, a direction of extension thereof being parallel to the second direction, and the rack being fixed to the mounting platform;

wherein the base further comprises:

a threaded rod having an axial direction parallel to the direction of extension of the rack and the threaded rod being rotatable in the axial direction thereof, the threaded rod being meshed with the rack, and rotation of the threaded rod driving movement of the rack in the direction of extension thereof; and a rotary knob, fixed to one end of the threaded rod.

7. A radio-frequency (RF) coil assembly, comprising:

an RF coil; and a stand assembly for said RF coil, said stand assembly comprising:

a base having a cavity formed therein, a slide carriage disposed on the base and in the cavity so as to be slidable in a first direction, and a connection assembly including a first connecting member having a first slide groove, and a second connecting member having a first slider, the first slider being slidable along the first slide groove in a sliding direction and fixable at a preset position, and one of the first connecting member and the second connecting member being in fixed connection with the slide carriage, and the other being in fixed connection with the RF coil, wherein:

the cavity includes two second slide grooves formed in sidewalls of the cavity, with openings of the second slide grooves being opposite one another and extending in the first direction; and the slide carriage includes two second sliders, the second sliders being disposed in the second slide grooves in one-to-one correspondence and being slidable in the second slide grooves.

8. The RF coil assembly as claimed in claim 7, wherein the RF coil is selected from the group consisting of a knee joint RF coil, a shoulder joint RF coil, a wrist joint RF coil, and a head RF coil.

9. A magnetic resonance imaging apparatus, comprising:

a magnetic resonance scanner a radio-frequency (RF) coil; and a stand assembly for said RF coil, said stand assembly comprising:

a base having a cavity formed therein, a slide carriage disposed on the base and in the cavity so as to be slidable in a first direction, and a connection assembly including a first connecting member having a first slide groove, and a second connecting member having a first slider, the first slider being slidable along the first slide groove in a sliding direction and fixable at a preset position, and one of the first connecting member and the second connecting member being in fixed connection with the slide carriage, and the other being in fixed connection with the RF coil, wherein:

the cavity includes two second slide grooves formed in sidewalls of the cavity, with openings of the second slide grooves being opposite one another and extending in the first direction; and the slide carriage includes two second sliders, the second sliders being disposed in the second slide grooves in one-to-one correspondence and being slidable in the second slide grooves.

* * * * *